Figure 1:
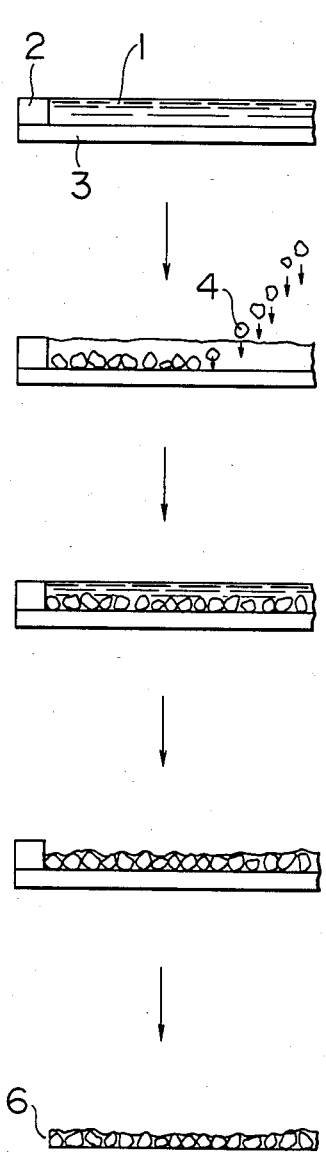

United States Patent [19]

Yanagida et al.

[11] Patent Number: 4,732,717
[45] Date of Patent: Mar. 22, 1988

[54] PROCESS FOR PRODUCING PIEZO-ELECTRIC OR PYRO-ELECTRIC COMPOSITE SHEET

[75] Inventors: Tomomi Yanagida; Kisaku Nakagawa, both of Yokohama; Hiroshi Tokuta, Hiratsuka; Toshimitsu Fukase, Odawara, all of Japan

[73] Assignee: Sumitomo Bakelite Company Limited, Tokyo, Japan

[21] Appl. No.: 783,685

[22] Filed: Oct. 3, 1985

[51] Int. Cl.⁴ .............................................. B29C 71/04
[52] U.S. Cl. ..................................... 264/22; 29/25.35; 264/24; 264/61; 264/81; 264/82; 264/128; 264/139; 264/162
[58] Field of Search ....................... 264/22, 24, 81–83, 264/139, 128, 125, 61, 104, 162, 1.2; 29/25.35

[56] References Cited

U.S. PATENT DOCUMENTS

| | | | |
|---|---|---|---|
| 3,164,645 | 1/1965 | De Vries et al. | 264/24 |
| 3,250,833 | 5/1966 | Wagner | 264/128 |
| 3,517,093 | 6/1970 | Wentzel | 264/61 |
| 3,620,933 | 11/1971 | Grunwald et al. | 264/139 |
| 3,694,243 | 9/1972 | Campbell | 264/125 |
| 4,265,841 | 5/1981 | Fujimori et al. | 264/22 |

FOREIGN PATENT DOCUMENTS

| | | | |
|---|---|---|---|
| 54-2144 | 4/1979 | Japan . | |
| 59-222308 | 12/1984 | Japan | 264/22 |
| 833840 | 5/1981 | U.S.S.R. | 264/22 |

OTHER PUBLICATIONS

"Flexible Composite Transducers", Mat. Res. Bull., vol. 13, pp. 599–607, 1978.
"Connectivity and Piezoelectric-Pyroelectric Composites", Mat. Res. Bull., vol. 13, pp. 525–536, 1978.

Primary Examiner—Jeffery Thurlow
Attorney, Agent, or Firm—Browdy and Neimark

[57] ABSTRACT

The invention provides a process for producing a piezo-electric or pyro-electric composite sheet in which particles of a piezo-electric or pyro-electric sintered body (ceramics) are dispersed in the form of a single layer in an insulating high polymeric substance, and the particles are in direct contact with electrodes made on both sides of the sheet. The composite sheet is produced by forming a sheet of an insulating high polymeric substance having dispersed therein particles of a piezo-electric or pyro-electric sintered body (ceramics) in the form of a single layer, then removing the surface skin from both sides of the sheet to expose the particles from both sides of the sheet; and making electrodes on both sides of the sheet and implying a voltage difference thereto to effect poling of the sheet.

18 Claims, 4 Drawing Figures

I  II

PROCESS FOR PRODUCING PIEZO-ELECTRIC OR PYRO-ELECTRIC COMPOSITE SHEET

This invention relates to a process for producing a piezo-electric or pyro-electric composite sheet having a structure in which particles of a piezoelectric or pyro-electric sintered body (ceramics) are dispersed in the form of a single layer in an insulating high polymeric substance (hereinafter referred to as the binder). The piezo-electric or pyro-electric composite sheet obtained according to the process of this invention, in combination with a proper firststage amplifier, can be applied as a high-sensitivity pressure- or temperature-sensitive sensor. It is also applicable to actuators, vibrators and transducers.

Many attempts have been made to obtain a piezo-electric or pyro-electric composite sheet having high flexibility and workability by dispersing the particles in the binder.

The conventional process for producing such a composite sheet comprised mixing the particles with a binder homogeneously and working the mixture into a sheet by a suitable means such as an extruder or the like.

The composite sheet produced through such conventional process was much poorer in piezo-electric or pyro-electric sensitivity than that of the sintered body itself (ceramics). The reasons are mentioned below.

(i) The individual particles in the composite sheet are in the state of being covered with the binder, and there are few particles which are in contact with the electrodes provided on both sides of the sheet.

(ii) Thus, the composite sheet may be considered to be equivalent electrically to the series connection of two condensors, one of which is insulated by the binder and the other is insulated by the particles.

(iii) When the composite sheet is placed in an electric field, the ratio of the electric field strengths in the two condensors is proportional to that of the reciprocals of their respective relative dielectric constants.

(iv) The relative dielectric constant of the particles is much larger than that of the binder. Numerically, the relative dielectric constant of the particles usually ranges from 100 to thousands, while that of the binder falls in the range of 3 to 10.

(v) Therefore, when the particles in the composite sheet are poled in the electric field having a strength sufficient to pole the particles (usually amounts to 3 to 20 kV/mm), the binder has to endure the electric field strength tens to thousand times higher than that in the particles and suffers dielectric breakdown.

(vi) Practically the composite sheet is obliged to be poled under the electric field having a strength lower than the dielectric breakdown of the binder, and the particles remain in a range of quite insufficient degree of poling.

Consequently the composite sheet prepared by the homogeneous blending particles with a resin has never been applied to any practical use.

Since the poor properties of the composite sheet prepared by the homogeneous blending are due to the structural drawback of particle dispersion, the only way to improve the properties is to accomplish the new procedure to bring about the desirable structure of particle dispersion.

It is desirable that every particle in the composite sheet is directly connected to the electrodes made on both sides of the sheet and is bound to each other by the binder. This structure of dispersion may be called as parallel because the voltage difference implied between the electrodes made on both sides of the sheet comes to be effective directly and equally to all particles and the binder. Since the breakdown strength of a usual binder exceeds that of the particles, it becomes possible to set the electric field strength necessitated to pole the particles sufficiently.

For producing a composite sheet of such a structure, there have been proposed some methods in which a plurality of bars or sticks made from a piezoelectric or pyro-electric sintered body are bundled and set by the binder to form a stack of the parallel columns, or a block of the sintered body is deeply notched crosswise and reinforced by pouring the binder into the notches to form a bundle of square columns, and such a stack or a bundle is sliced into the composite sheets. These methods, however, have a serious difficulty in obtaining a thin composite sheet because of the high hardness and fragility of the sintered columns.

The present invention provides a simple and economical process for producing a piezo-electric or pyro-electric composite sheet having a structure in which particles of a piezo-electric or pyro-electric sintered body are dispersed in the form of a single layer in a binder. The composite sheet produced from the process of this invention has high sensitivity and excellent secondary workability and flexibility.

The process for producing a composite sheet according to this invention comprises the steps of forming a sheet having the particles of a piezo-electric or pyro-electric sintered body dispersed in the form of a single layer in a binder; removing the surface skin from both sides of the sheet to expose the individual particles; and making electrodes on both surfaces of the sheet and implying a voltage therebetween to effect poling of the sheet.

The process of the present invention includes two methods.

According to the first method, there is provided a process for producing a piezo-electric or pyro-electric composite sheet of a structure in which particles of a priezo-electric or pyro-electric sintered body are dispersed in the form of a single layer in an insulating high polymeric substance and said particles are in direct contact with electrodes made on both sides of the sheet, which process comprises:

(i) coating a liquid insulating high polymeric substance to a uniform thickness on a carrier having a smooth surface, strewing particles of a piezo-electric or pryo-electric sintered body on said insulating high polymeric substance to form a single layer of the particles, curing or solidifying said insulating high polymeric substance, and then removing said carrier to obtain a sheet of said insulating high polymeric substance in which the piezo-electric or pyro-electric sintered body particles are dispersed in the form of a single layer;

(ii) removing the surface skin from both sides of the resultant sheet by a mechanical or chemical means to expose from both sides of the sheet the piezo-electric or pyro-electric sintered body particles dispersed in the form of a single layer; and (iii) making electrodes on both sides of said sheet and implying a voltage thereto to effect poling of the sheet.

According to the second method, there is provided a process for producing a piezo-electric or pyro-electric composite sheet of a structure in which particles of a piezo-electric or pyro-electric sintered body are dispersed in the form of a single layer in an insulating high polymeric substance and said particles are in direct contact with electrodes made on both sides of the sheet, which process comprises:

(i) spreading particles of a piezo-electric or pyro-electric sintered body on a pressure-sentitive adhesive coated on the smooth surface of a carrier or on a pressure-sensitive adhesive film thereby allowing said particles to adhere on said adhesive, and removing the superfluous particles which have not adhered to said adhesive, thereby to form a structure in which said particles are dispersed in the form of a single layer;

(ii) casting a liquid insulating high polymeric substance into the spaces between the particles adhering to said adhesive to cover said particles, curing or solidifying said polymeric substance and then removing the adhesive layer to obtain a sheet of said insulating high polymeric substance having said piezo-electric or pyro-electric sintered body particles dispersed in the form of a single layer;

(iii) removing the surface skin from both sides of the resultant sheet by a mechanical or chemical means to expose the piezo-electric or pyro-electric sintered body particles dispersed in the form of a single layer from both sides of said sheet; and (iv) making electrodes on both sides of said sheet and implying a voltage thereto to effect poling of the sheet.

More particularly, according to the first method, a liquid insulating high polymeric substance composed of a heat-resistant liquid thermoplastic or thermosetting resin (binder) is applied on a carrier to form a coating thereon, and then the particles of a piezo-electric or pyro-electric sintered body having a particle size such that they do not pass through 20 $\mu$m meshes but through 148 $\mu$m meshes when sieved by an ASTM standard sieve are dropped onto said coating by using a sieve or other means and dispersed in the form of a single layer on the surface of the carrier in said coating. Thereafter the coating is dried to effect preliminary solidification or curing of the polymeric substance, and after removing the carrier, said sheet is held between cauls and subjected to heating, pressing or radiant ray irradiation to complete solidification or curing of the polymeric substance. The surface skin on both sides of the resultant sheet having a single layer of the particles formed therein is removed by grinding with sandpaper, surface grinder, sandblast, etc., or by etching.

Removal of surface skin is made to the extent satisfying the relation of $B/A \geqq 0.5$ on each side, where A is the sum of the projected areas of the individual particles with light projected vertically to the sheet and B is the sum of the areas of exposed portions of the particles on one side of the sheet.

Electrodes are made on both sides of the sheet, with the particles exposed therefrom, by means of vacuum deposition, ion-plating or sputtering of a metal such as gold, silver, copper, aluminum or the like, and a voltage is implied to said electrodes for effecting poling thereby to obtain a piezo-electric or pyroelectric composite sheet.

According to the second method, particles of a piezo-electric or pyro-electric sintered body are spread on a pressure-sensitive adhesive coated on the smooth surface of a carrier or on a pressure-sensitive adhesive film so that the particles adhere on said adhesive. In this case, an excess amount of the particles may be spread on the adhesive, and it is not essential that the particles be spread in the form of just a single layer. After spreading the particles on the adhesive, the particle-deposited adhesive film is upset, whereby the superfluous particles, which failed to adhere to the adhesive, can be easily removed. The particles adhering on the adhesive remain dispersed in the form of a single layer.

Then a heat-resistant liquid binder is cast into the spaces between the particles deposited on the adhesive to cover the particles with said binder, and then the binder is dried for effecting preliminary solidification or curing thereof. After removing the adhesive film, the binder is completely solidified or cured by the same means as employed in the first method described previously. The subsequent steps are the same a mentioned in the first method.

In the accompanying drawings, FIG. 1 illustrates a process for producing a sheet having the piezo-electric or pyro-electric sintered body particles dispersed in the form of a single layer in a binder according to the first method of this invention.

Figure 2:
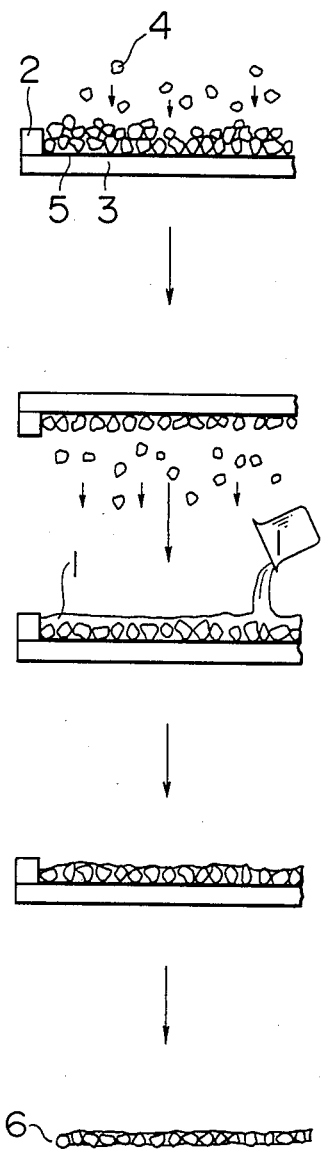

FIG. 2 illustrates a process for obtaining said sheet according to the second method of this invention.

Figure 3:
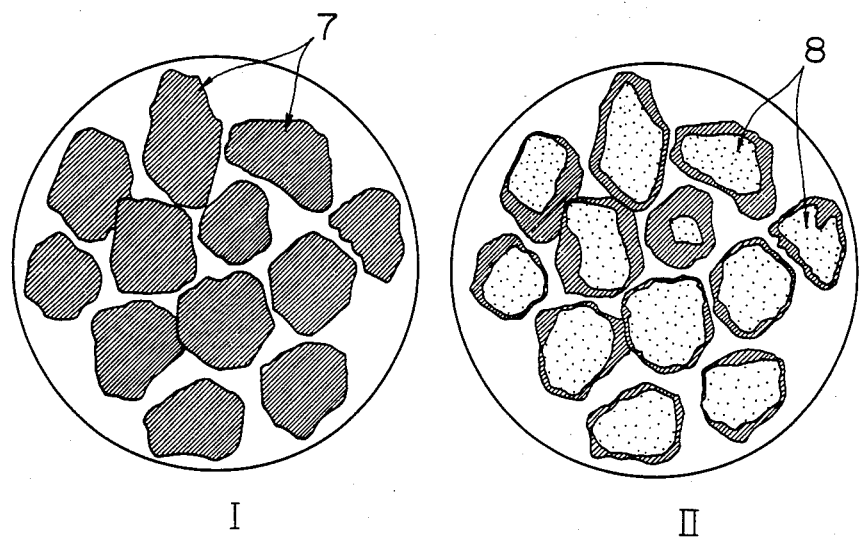

FIG. 3 shows magnified surface views of the sheet having the surface skin on both sides thereof removed to expose the particles. In FIG. 3, I is a drawing to be used for determining the sum A of the vertically projected areas of the particles by the light permeated through the sheet, and II is a drawing to be used for determining the sum B of the area of the exposed portions of the particles as observed by reflected light.

Legend in the drawings:

1: liquid binder (insulating high polymeric substance)
2: spacer
3: carrier
4: particles of a piezo-electric or pyro-electric sintered body
5: pressure-sensitive adhesive film
6: section of a sheet in which the particles are dispersed in the form of a single layer
7: projected portions of the dispersed particles with light vertically projected
8: exposed portions of the dispersed particles The piezo-electric or pyro-electric sintered body used in this invention is a sintered body comprising an aggregation of crystal bodies which contain the domains of spontaneous polarization, with neither electric field nor any external force applied thereto.

Various materials can be used for composing such a sintered body, the typical examples thereof being materials having perovskite crystal structure, i.e. barium titanate, modified lead titanate, lead titanate zirconate and its modified version, tantalate, and the like.

For forming the particles of such a sintered body for use in this invention, said sintered body is crushed by a mechanical or thermal shock or other means and classified depending on the intended thickness of the composite sheet to be produced, with the best suited fraction being selected.

Prior to the classification, it is desirable to round the crushed particles by a suitable working such as ball milling, since the rounded particles prove to be easy to disperse uniformly in the next step and also to increase affinity to the binder, and to decrease formatioh of voids in the interface between the particle and the binder.

The particles as crushed mechanically have a roundness of less than 0.01 in Wadells's Round Index (H. Wadell: Journal of Geology, 40, pp. 443–451, 1932), but it is desirable that the particles used in this invention have a large value of Round Index, usually 0.2 or more for bringing about the effects intended to provide in this invention.

The piezo-electric or pyro-electric sintered body has a structure comprising an aggregation of fine crystals, and usually such a sintered body has defective portions such as voids in its inside. It becomes to have a higher dielectric strength and a higher apparent density when it is free of such defective portions.

When the sintered body is crushed into fine particles, said defective portions such as voids are mostly exposed to the cracked surface, and the volume of the defective portions decreases as the particle size is reduced.

Thus, it is highly desirable that the particle size be reduced to a maximal degree in the scope safe from causing any impediment to the production of the desired composite sheet.

Practically, in the process of this invention, the particle size is preferably in the range such that the particles do not pass through 20 $\mu$m meshes but through 148 $\mu$m meshes, more preferably, such that they do not pass through 20 $\mu$m meshes but through 53 $\mu$m meshes, when sieved by an ASTM standard sieve.

With a particle size of less than 148 $\mu$m, the number of the defective portions such as voids in the particles per unit volume is reduced to an extent sufficient to produce the effect of improving dielectric strength.

With a particle size of around 53 $\mu$m, it is possible to maintain a dielectric strength equivalent to more than 50% of the electric field strength necessary for the poling.

On the other hand, if a particle size is less than 20 $\mu$m, sheet workability is reduced and also the produced sheet having the dispersed particles exposed on both sides thereof becomes excessively small in thickness, so that the composite sheet obtained therefrom proves to be too weak in strength and hard to treat.

Any type of a binder which is heat resistant and insulating and also capable of retaining said sintered body particles, can be used in this invention. Preferred examples of such a binder for use in this invention are thermoplastic resins such as polyethersulfone and polycarbonate, and thermosetting resins such as polyimide, polyamideimide, epoxy resin and modified resins thereof.

In forming a binder sheet having said particles dispersed therein as a single layer, it is desirable to apply a suitable treatment such as application of a releasing agent on a flat carrier.

For removing the sheet surface skin till the ends of the individual particles are exposed from both sides of the sheet, there can be employed known means such as surface grinding by sandpaper, surface grinder, etc., or mechanical means such as sandblasting in which abrasive granules are jetted against the sheet surface to let it wear off or liquid honing. It is also possible to apply a method in which the binder is chemically etched away (by using, for instance, an aqueous solution of hydrazine for polyimide). Chipping-off of the particle surfaces in the sheet surface skin-removing operation causes no problem, but care must be taken so that the particles won't be cracked or the particles themselves won't fall off and that the binder section will remain free of pinholes or damage.

In the process of this invention, the step of exposing the particle ends from both sides of the sheet is especially important, and care needs to be taken so that the particle surfaces exposed won't be denatured or contaminated with other substances before proceeding into the subsequent steps. The larger the exposed surfaces of the particles, the more extensive is the poling action exerted to the particles, resulting in a corresponding improvement of piezo-electric or pyro-electric characteristics of the product sheet.

The B/A ratio, or the ratio of the sum (B) of the areas of the exposed portions of the particles on each side of the sheet to the sum (A) of the vertically projected areas of the particles in the sheet, which ratio indicates the degree of exposure, is preferably greater than 0.5, more preferably greater than 0.75.

In determining the B/A ratio, the projection produced by the light permeated through the sheet is used for determining the projected areas, while reflected light from the particle surfaces is utilized for determining the areas of the exposed portions, as illustrated in FIG. 3.

In the present invention, the conventional wet or dry surface metallizing techniques can be applied for making electrodes on both sides of the sheet. For instance, electrodes can be made by sputtering, vacuum deposition or ion-plating of a metal such as gold, silver, copper or aluminum. Also, electroless plating or conductive coating, or a combination of these techniques can be employed.

In this invention, poling can be accomplished in a known way, but a voltage is implied after making sure that the electrodes made on both sides of the sheet are not shortcircuited.

The voltage to be implied depends on the type of the piezo-electric or pyro-electric sintered body and the thickness of the sheet, and usually it is sufficient to imply a voltage necessary for poling the sintered body itself.

For instance, the electric field strength necessary for poling a sintered body of lead titanate zirconate (NEPEC® N-21 by Tohoku Metal Industries) is 6 KV/mm, so that if the thickness of the composite sheet using the particles of said sintered body is assumed to be 50 $\mu$m, then the voltage which needs to be implied is 0.3 KV (6 KV/mm×0.05 mm). Use of polyimide as a binder enables poling of the sintered body with no fear of causing damage, since polyimide has a dielectric strength much higher than 10 KV/mm.

According to the process of this invention, it is possible to obtain easily and economically a piezo-electric or pyro-electric composite sheet having a high piezo- or pyro-electric property together with the excellent workability and flexibility, and thus the process of this invention can be advantageously applied to the industrial production of such composite sheet.

The piezo-electric or pyro-electric composite sheet produced according to the process of this invention can be applied to the same uses as those of the conventional sintered bodies themselves, for example, to a piezo-electric sensor capable of sensing external pressure, a temperature sensor capable of sensing change in temperature with time, or an infrared sensor.

It is possible with the composite sheet of this invention to enlarge the sensitive area of a sensor by tens of times as compared with the case where the sintered bodies themselves are employed, and this brings about the improvement in the sensitivity of the sensor.

The process of this invention is further described below by way of the examples thereof.

EXAMPLE 1

A sintered body of lead titanate zirconate (crushed granules of NEPEC® N-21 produced by Tohoku Metal Industries, hereinafter referred to as N-21) was put into a pot of 10 cm in diameter and subjected to a 50-hour mixing treatment under rotation at a speed of 105 r.p.m. together with alumina ceramic balls of two different sizes, one being 6 mm in diameter and the other 2 mm in diameter, both being mixed together. The mixture was sieved to obtain the particles of a size falling in the range less than 37 μm but more than 20 μm with an ASTM standard sieve. These particles had a Wadell's Round Index of 0.2 on the average.

A solution of a binder was applied on one side of an aluminum foil to form a coat thereon with a knife coater, and the previously prepared particles of N-21 were uniformly strewed on said coat so that the particles wouldn't lie one upon another. Said coating was made to have a thickness of about 20 μm after drying. As the binder, there was used polyamideimide which is a heat-resistant thermosetting resin, in the form of a solution (AI varnish dissolved in an N-methylpyrrolidone-solvent naphtha mixed solvent produced by Furukawa Denko, hereinafter referred to as PAI) with a resin content of 22% by weight. Strewing of said N-21 particles was made to a concentration of 80–90 particles per 1 mm².

This preparation was placed in a vacuum dryer of 40° C. for effecting sufficient desolvation while solidifying the coating. It was then immersed in a ferric chloride solution to etch out the aluminum foil, obtaining a sheet having the N-21 particles dispersed therein in the form of a single layer. The sheet was further dried at 80° C. for 60 minutes and then compressed and cured at 200° C. for 30 minutes with a press. Thereafter, the sheet was ground with a #1,000 to #1,500-grit sandpaper to expose most of the particles from both sides of the sheet. Grinding was made until the degree of exposure (B/A) of the particles became 0.80. The sheet thickness was 16±4 μm. One μm thick copper films were made as electrodes on both sides of the sheet by sputtering. A DC voltage of 96 V (average electric field strength: 6 KV/mm) was applied between the electrodes on both sides of the sheet at room temperature for 15 minutes to effect poling of the sheet, thereby producing a composite sheet. This composite sheet had very excellent piezoelectric and pyro-electric properties. It also had high heat resistance and lead wire could be firmly connected to the electrodes by soldering. Other properties of this composite sheet are shown in Table 1.

EXAMPLE 2

A composite sheet was produced according to the same process and under the same conditions as in Example 1 except that the N-21 particle sizes were in the range of less than 148 μm but more than 120 μm and that the coating solution was applied so that the coating thickness would become about 70 μm after drying. This composite sheet had excellent piezoelectric and pyro-electric properties, the specific characteristics thereof being shown in Table 1.

EXAMPLE 3

A composite sheet was produced according to the same process and under the same conditions as in Example 1 except that grinding was made until the degree of exposure (B/A) of N-21 particles attained to 0.60. This composite sheet showed excellent piezo-electric and pyro-electric properties, the evaluated characteristics thereof being shown in Table 1. The characteristic properties of this composite sheet are somewhat inferior to those of the composite sheets of Examples 1 and 2.

EXAMPLE 4

A composite sheet was produced according to the same process and under the same conditions as in Example 1 except that an N-methylpyrrolidone solution (resin content: 22 wt %) of a heat-resistant thermoplastic resin, polyether sulfone (produced by UCC, hereinafter referred to as PES) was used as a binder. Lead wire connection to this composite sheet was made with a conductive paste. Both piezo-electric and pyro-electric properties of this composite sheet were very excellent, the evaluated characteristics thereof being shown in Table 1.

EXAMPLE 5

A composite sheet was produced according to the same process and under the same conditions as in Example 1 except that the sheet having the N-21 particles dispersed in the form of a single layer as obtained in Example 1 was fixed on a suction board provided on a surface grinder and each side of the sheet was ground one by one with a grinder having a finish precision of the order of 1 μm. The properties of this composite sheet was equal to those of Example 1, but the working time for finishing to the same degree of particle exposure (B/A) was reduced to about ⅓ in comparison with Example 1.

EXAMPLE 6

A composite sheet was produced according to the same process and under the same conditions as in Example 1 except that a 1 μm thick silver coat was made on both sides of the sheet by vacuum deposition instead of sputtering. A conductive paste was applied for lead wire connection to this composite sheet. This composite sheet had excellent piezo-electric and pyro-electric properties, the specific characteristics thereof being shown in Table 1.

EXAMPLE 7

A composite sheet was produced according to the same process and under the same conditions as in Example 1 except that calcium titanate-modified lead titanate (NEPEC® N-200 produced by Tohoku Metal Industries, a material especially characterized by its pyro-electric properties, hereinafter referred to as N-200) was used for the sintered body and that poling of the sheet was effected at 180° C. This composite sheet was slightly inferior in piezo-electric coefficient to the sheet made by using N-200 itself but had very excellent pyro-electric properties. The specific characteristics thereof are shown in Table 1.

EXAMPLE 8

A sintered body of lead titanate zirconate (crushed particles of NEPEC® N-21 produced by Tohoku Metal Industries, hereinafter referred to as N-21) was treated with mixed 6 mm-diameter and 2 mm-diameter alumina ceramic balls in a 10 cm-diameter pot under rotation at a speed of 105 r.p.m. for 50 hours and then sieved to select the particles of a size in the range of less than 37 μm but more than 20 μm with an ASTM standard sieve. The particles had a Wadell's Round Index of 0.2 on the average.

A double-coated pressure-sensitive adhesive tape, mfd. by Teraoka Seisakusho, was bonded on one side of an aluminum foil, and said sieved N-21 particles were spread sufficiently thereon. The foil thus coated was upset to throw off the superfluous particles which have not adhered to the adhesive. Then the spaces between the particles dispersed as a single layer were filled with the binder to cover the particles.

As the binder there was used polyamideimide which is a heat-resistant thermosetting resin, in the form of a solution (AI varnish dissolved in an N-methylpyrrolidone-solvent naphtha mixed solvent produced by Furukawa Denko, hereinafter referred to as PAI) with a resin content of 10% by weight.

The preparation was placed in a vacuum dryer to effect sufficient defoaming and then heated at 80° C. for 60 minutes for desolvation. Thereafter, aluminum foil and adhesive were stripped off to obtain a sheet in which the N-21 particles were dispersed in the form of a single layer. This sheet was further dried at 80° C. for 60 minutes, followed by compression at 200° C. in a press for 30 minutes and sufficient curing. Then the sheet was ground with #1,000 to #1,500-grit sandpaper to expose most of the particles on both sides of the sheet. Grinding was made till the degree of exposure (B/A) of the particles of 0.80 was attained. The sheet thickness was 16±4 µm. As electrodes, a 1 µm thick copper film was made on both sides of the sheet by sputtering. A DC voltage of 96 V (average electric field strength: 6 KV/mm) was applied between the electrodes on both sides of the sheet at room temperature for 15 minutes to effect poling of the sheet, thereby forming a composite sheet. This composite sheet had very excellent piezo-electric and pyro-electric properties. It also had high heat resistance, and lead wire could be connected to the electrodes by soldering. Other characteristics of the sheet are shown in Table 1.

EXAMPLE 9

A composite sheet was produced according to the same process and under the same conditions as in Example 8 except that the N-21 particle sizes were in the range of less than 148 µm but more than 120 µm, and that the solution casting was made such that the coating thickness would become 70 µm after drying. This composite sheet had excellent piezo-electric and pyro-electric properties, with the evaluated characteristics thereof shown in Table 1.

EXAMPLE 10

A composite sheet was produced according to the same process and under the same conditions as in Example 8 except that grinding was made until the degree of exposure (B/A) of N-21 particles became 0.60. This composite sheet showed excellent piezo-electric and pyro-electric properties, the specific characteristics thereof being shown in Table 1.

EXAMPLE 11

A composite sheet was produced according to the same process and under the same conditions as in Example 8 except that an N-methylpyrrolidone solution of a heat-resistant thermoplastic resin, polyethersulfone (produced by UCC, hereinafter referred to as PES) (resin content of the solution being 22 wt %) was used as a binder. Lead wire connection to this composite sheet was carried out with a conductive paste. This composite sheet had excellent piezo-electric and pyro-electric properties, and the evaluated characteristics thereof are shown in Table 1.

EXAMPLE 12

A composite sheet was produced according to the same process and under the same condiitons as in Example 8 except that the sheet having the N-21 particles dispersed in the form of a single layer was fixed on a suction board provided on a surface grinder and each side of the sheet was ground one by one with a grinder having a finish precesion of the order of 1 µm. The properties of this composite sheet were the same as those of the sheet of Example 8, but the working time required for finishing to the same degree of particle exposure (B/A) was reduced to about ⅓ in comparison with Example 8.

EXAMPLE 13

A composite sheet was produced according to the same process and under the same conditions as in Example 8 except that a 1 µm thick silver coat was made on both sides of the sheet by vacuum deposition instead of sputtering. Conductive paste was used for lead wire connection to this composite sheet. This composite sheet had excellent piezo-electric and pyro-electric properties, the specific characteristics thereof being shown in Table 1.

EXAMPLE 14

A composite sheet was produced according to the same process and under the same condiitons as in Example 8 except that calcium titanate-modified lead titanate (NEPEC N-200 produced by Tohoku Metal Industries, a material especially characterized by its pyro-electric properties, hereinafter referred to as N-200) was used as a sintered body and that poling of the sheet was effected at 180° C. This composite sheet was somewhat inferior in piezo-electric coefficient to the composite sheet produced by using N-200 itself but had very excellent pyro-electric properties. The specific characteristics thereof are shown in Table 1.

EXAMPLE 15

A composite sheet was produced by following the same process as in Example 1 but by using the N-21 particles having a Wadell's Round Index of 0.5 on the average. The properties of this composite sheet are shown in Table 1.

EXAMPLE 16

A composite sheet was produced according to the same process as in Example 8 but by using the N-21 particles having a Wadell's Round Index of 0.4 on the average. The properties of this composite sheet are shown in Table 1.

COMPARATIVE EXAMPLE 1

Composite sheets were produced according to the same process and under the same conditions as in Example 1 except for use of the N-21 particles with the sizes in the range of less than 177 µm but more than 149 µm. In the step of poling, 4 among 10 sheets produced were damaged due to dielectric breakdown.

COMPARATIVE EXAMPLE 2

Composite sheets were produced according to the same process and under the same conditions as in Example 8 except for use of the N-21 particles with the size in the range of less than 177 μm but more than 149 μm. In the step of poling, 6 among 10 sheets produced were damaged due to dielectric breakdown.

COMPARATIVE EXAMPLE 3

It was tried to produce 10 composite sheets according to Example 1 but by using the fine N-21 particles with sizes of less than 20 μm, but all the composite sheets were damaged before reacing the exposure degree (B/A) of 0.1 and no complete sheet was obtained

COMPARATIVE EXAMPLE 4

It was tried to produce 10 composite sheets according to Example 8 but by using the fine N-21 particles with sizes of less than 20 μm, but all the composite sheets were damaged before reaching the exposure degree (B/A) of 0.1 and no complete composite sheet was obtained.

COMPARATIVE EXAMPLE 5

A composite sheet was produced according to the same process as in Example 8 except that the N-21 particles were scarcely exposed, with the degree of exposure (B/A) being less than 0.1. This composite sheet showed a low level of piezo-electric and pyro-electric properties as shown in Table 1.

COMPARATIVE EXAMPLE 6

N-21 particles of not less than 20 μm used in Comparative Example 4 and AI varnish were mixed in a ratio by weight of 8 to 1, and the mixture was coated on an aluminum foil carrier and dried. After removing the aluminum foil by chemical etching, the remaining sheet was heated at 80° C. for 30 minutes. This sheet was subjected to heating and hardening in a press at 200° C. for 30 minutes. Then a thin copper film of 1 μm in thickness was made on both sides of said sheet by sputtering. This laminate sheet was poled by implying a voltage for an average electric field strength of 12 KV/mm at room temperature for 15 minutes to produce a composite sheet. The piezo-electric and pyro-electric properties of this composite sheet were of a low level 1 as shown in Table 1.

COMPARATIVE EXAMPLE 7

A block of N-21 sintered body was cut to a 100 μm thick slab by a diamond saw and then a 1 μm thick copper film was provided on both sides thereof by sputtering. This slab was poled in a transformer oil by implying a voltage for an average electric field strength of 4 KV/mm at room temperature for 15 minutes to produce a sintered body slab. The properties of this slab are shown in Table 1.

COMPARATIVE EXAMPLE 8

A block of N-200 sintered body was cut to a 100 μm thick slab by a diamond saw and a 1 μm thick copper film was made on both sides thereof by sputtering. This slab was poled in a transformer oil by implying a voltage for an average electric field of 4 KV/mm at 180° C. for 15 minutes to produce a sintered body slab having the properties shown in Table 1.

COMPARATIVE EXAMPLE 9

Composite sheets were produced in the same way as in Example 1 except for use of the N-21 particles which had not been subjected to ball mill treatment and which had a Wadell's Round Index of 0.1 or below on the average.

Seven among 10 sheets suffered from dielectric breakdown in the step of poling. It is considered that this dielectric breakdown was caused by fine air bubbles produced in the interfaces between the particle surfaces and the binder due to small roundness of the particles.

Comparative example 10

Composite sheets were produced in the same way as in Example 8 except for use of the N-21 particles which had not been subjected to ball mill treatment and which had a Wadell's Round Index of 0.1 or below on the average. Eight among 10 sheets suffered from dielectric breakdown in the step of poling. This dielectric breakdown is considred to have been caused by fine air bubbles produced in the interfaces between the particle surfaces and the binder due to small roundness of the particles.

TABLE 1

| | Producing conditions and evaluated characteristics | | | | | | | |
|---|---|---|---|---|---|---|---|---|
| | Producing conditions | | | | | | | |
| | Sintered body | | | | | | Exposure | |
| | | Particle size | | | | | | |
| | Material | Pass (μm) | Stop (μm) | Round index | Binder | Formation of single layer | Method | Degree of exposure (B/A) | Electrode metallization |
| Example | | | | | | | | | |
| 1 | N21 | 37 | 20 | 0.2 | PAI | First method | Sand paper | 0.8 | Sputter Cu |
| 2 | " | 148 | 120 | " | " | " | " | " | " |
| 3 | " | 37 | 20 | " | " | " | " | 0.6 | " |
| 4 | " | " | " | " | PES | " | " | 0.8 | " |
| 5 | " | " | " | " | PAI | " | Surface grinder | " | " |
| 6 | " | " | " | " | " | " | Sand paper | " | V.D. Ag |
| 7* | N200 | " | " | " | " | " | " | " | Sputter Cu |
| 8 | N21 | " | " | " | " | Second method | " | " | " |
| 9 | " | 148 | 120 | " | " | " | " | " | " |
| 10 | " | 37 | 20 | " | " | " | " | 0.6 | " |
| 11 | " | " | " | " | PES | " | " | 0.8 | " |
| 12 | " | " | " | " | PAI | " | Surface grinder | " | " |
| 13 | " | " | " | " | " | " | Sand paper | " | V.D. Ag |
| 14* | N200 | " | " | " | " | " | " | " | Sputter Cu |
| 15 | N21 | " | " | 0.5 | " | First method | " | " | " |

TABLE 1-continued

| | Producing conditions and evaluated characteristics | | | | | | | | |
|---|---|---|---|---|---|---|---|---|---|
| 16 Comp. Example | " | " | " | 0.4 | " | Second method | " | " | " |
| 3 | " | 20 | — | 0.2 | " | First method | " | — | — |
| 4 | " | " | — | " | " | Second method | " | — | — |
| 5 | " | 37 | 20 | " | " | " | " | .01> | Sputter Cu |
| 6 | " | 20 | — | " | " | — | — | — | " |
| 7 | " | — | — | — | — | — | — | — | " |
| 8 | N200 | — | — | — | — | — | — | — | " |

| | Producing conditions Poling conditions | | | Evaluated characteristics | | | | |
|---|---|---|---|---|---|---|---|---|
| | Environment | Time min | Electric field strength kV/mm | $V_B$ kV/mm | $\epsilon_r$ | $d_{31}$ C/N ($\times 10^{-12}$) | $\lambda$ C/cm² deg ($\times 10^{-9}$) | $R_V$ V/W |
| Example | | | | | | | | |
| 1 | R.T. | 15 | 6 | 18 | 300 | 34 | 11 | 1.6 |
| 2 | " | " | " | 10 | " | 33 | 10 | 1.4 |
| 3 | " | " | " | 20 | 250 | 25 | 5 | 0.9 |
| 4 | " | " | " | 18 | 300 | 34 | 10 | 1.5 |
| 5 | " | " | " | " | " | 35 | 9 | 1.5 |
| 6 | " | " | " | " | " | 35 | 10 | 1.6 |
| 7* | 180° C. | " | " | " | 40 | 0.4 | 5.5 | 10.0 |
| 8 | R.T. | " | " | " | 800 | 85 | 25 | 1.6 |
| 9 | " | " | " | " | " | 80 | 23 | " |
| 10 | " | " | " | 20 | 600 | 60 | 15 | 0.9 |
| 11 | " | " | " | 18 | 800 | 82 | 22 | 1.5 |
| 12 | " | " | " | " | " | 83 | 20 | 1.6 |
| 13 | " | " | " | " | " | 80 | 25 | 1.6 |
| 14* | 180° C. | " | " | " | 100 | 1.1 | 15 | 11.0 |
| 15 | R.T. | " | " | 10 | 300 | 32 | 9 | 1.6 |
| 16 Comp. Example | " | " | " | 6 | 800 | 81 | 22 | 1.6 |
| 3 | — | — | — | — | — | — | — | — |
| 4 | — | — | — | — | — | — | — | — |
| 5 | R.T. | 15 | 6 | 25 | 20 | 0.3 | 0.1 | 0.2 |
| 6 | " | " | 12 | 15 | 50 | 0.8 | 0.3 | 0.2 |
| 7 | R.T. in oil | " | 4 | 6 | 1800 | 198 | 5.9 | 0.5 |
| 8 | 180° C. in oil | " | 4 | 6 | 210 | 4 | 4.9 | 5.6 |

1 Legend in evaluated characteristics in Table 1:
(1) $V_B$: dielectric breakdown voltage (in a transformer oil at 180° C.)
(2) $\epsilon_r$: relative dielectric constant (1 KHz)
(3) $d_{31}$: piezo-electric coefficient (Z-X, 10 Hz)
(4) $\lambda$: pyro-electric coefficient
(5) $R_V$: voltage responsivity (measured at chopping frequency of 8 Hz for specimen area of 1 cm² with blacked light-receiving surface)
*Examples 7 and 14 are the examples which showed excellent pyroelectric responsivity.

What is claimed is:

1. A process for producing a piezo-electric or pyro-electric composite sheet of a structure in which particles of a piezo-electric or pyro-electric sintered body are dispersed in the form of a single layer in the insulating high polymeric substance and said particles are in direct contact with electrodes made on both sides of the sheet, which process comprises:

(i) coating a liquid insulating high polymeric substance to a uniform thickness on a carrier having a smooth surface, strewing particles of a piezo-electric or pyro-electric sintered body on said insulating high polymeric substance to form a single layer of the particles, said particles having a size such that they do not pass through 20 microns meshes but do pass through 148 micron meshes, curing or solidifying said insulating high polymeric substance, and then removing said carrier to obtain a sheet of said insulating high polymeric substance in which the piezo-electric or pyro-electric sintered body particles are dispersed in the form of a single layer;

(ii) removing the surface skin from both sides of the resultant sheet by a mechanical or chemical means until the degree of exposure of the piezo-electric or pyro-electric sintered body particles exposed from the sheet surfaces, defined as the ratio of the sum (B) of the areas of the exposed portions of the individual particles to the sum (A) of the vertically projected areas of the individual particles (B/A ratio), becomes 0.5 or more, to expose from both sides of the sheet the piezo-electric or pyro-electric sintered body particles dispersed in the form of a single layer; and (iii) making electrodes on both sides of said sheet and implying a voltage thereto to effect poling of the sheet.

2. A process for producing a composite sheet according to claim 1, wherein the piezo-electric or pyro-electric sintered body particles have a size such that they do not pass through 20 μm meshes but do pass through 53 μm meshes.

3. A process for producing a composite sheet according to claim 1, wherein the piezo-electric or pyro-electric sintered body particles have a Wadell's Round Index of 0.2 or more.

4. A process for producing a composite sheet according to claim 1, wherein the surface skin is removed by grinding or etching till the B/A ratio of 0.75 or more is attained.

5. A process for producing a composite sheet according to claim 1, wherein the insulating high polymeric substance is a heat-resistant thermoplastic resin.

6. A process for producing a composite sheet according to claim 1, wherein the insulating high polymeric substance is a heat-curable or radiation-curable heat-resistant thermosetting resin.

7. A process for producing a composite sheet according to claim 1, wherein metallic thin film electrodes are made by sputtering, vacuum deposition or ion-plating on both sides of the sheet from which the piezo-electric or pyro-electric sintered body particles are exposed.

8. A process for producing a composite sheet according to claim 1, wherein the electrodes are made by electroless plating or conductive coating on both sides of the sheet from which the piezo-electric or pyro-electric sintered body particles are exposed.

9. A process for producing a piezo-electric or pyro-electric composite sheet of a structure in which particles of a piezo-electric or pyro-electric sintered body are dispersed in the form of a single layer in an insulating high polymeric substance and said particles are in direct contact with electrodes made on both sides of the sheet, which process comprises:
   (i) spreading particles of a piezo-electric or pyro-electric sintered body on a pressure-sensitive adhesive coated on the smooth surface of a carrier or on a pressure-sensitive film, said particles having a size such that they do not pass through 20 micron meshes but do pass through 148 micron meshes, thereby allowing said particles to adhere on said adhesive, and removing the superfluous particles which have not adhered to said adhesive, thereby to form a structure in which said particles are dispersed in the form of a single layer;
   (ii) casting a liquid insulating high polymeric substance into the spaces between the particles adhering to said adhesive to cover said particles, curing or solidfying said polymeric substance and then removing the adhesive layer to obtain a sheet of said insulating high polymeric substances having said piezo-electric or pyro-electric sintered body particles dispersed in the form of a single layer;
   (iii) removing the surface skin from both sides of the resultant sheet by a mechanical or chemical means until the degree of exposure of the piezo-electric or pyro-electric sintered body particles exposed from the sheet surfaces, defined as the ratio of the sum (B) of the areas of the exposed portions of the individual particles to the sum (A) of the vertically projected areas of the individual particles (B/A ratio), becomes 0.5 or more, to expose the piezo-electric or pyro-electric sintered body particles dispersed in the form of a single layer from both sides of said sheet; and
   (iv) making electrodes on both sides of said sheet and implying a voltage thereto to effect poling of the sheet.

10. A process for producing a composite sheet according to claim 9, wherein the piezo-electric or pyro-electric sintered body particles have a size such that they do not pass through 20 $\mu$m meshes but do pass through 53 $\mu$m meshes.

11. A process for producing a composite sheet according to claim 9, wherein the piezo-electric or pyro-electric sintered body particles have a Wadell's Round Index of 0.2 or more.

12. A process for producing a composite sheet according to claim 9, wherein the surface skin is removed by grinding or etching unit the B/A ratio of 0.75 or more is attained.

13. A process for producing a composite sheet according to claim 9, wherein the insulating high polymeric substance is a heat-resistant thermoplastic resin.

14. A process for producing a composite sheet according to claim 9, wherein the insulating high polymeric substance is a heat-curable or radiation-curable heat-resistant thermosetting resin.

15. A process for producing a composite sheet according to claim 9, wherein metallic thin film electrodes are made by sputtering, vacuum deposition or ion-plating on both sides of the sheet from which the piezo-electric or pyro-electric sintered body particles are exposed.

16. A process for producing a composite sheet according to claim 9, wherein electrodes are made by electroless plating or conductive coating on both sides of the sheet from which the piezo-electric or pyro-electric sintered body particles are exposed.

17. The process of claim 1 wherein said removing step is performed by grinding or etching.

18. The process of claim 9 wherein said removing step is performed by grinding or etching.

* * * * *